ARRANGEMENT OF ELECTRICAL CIRCUITS AND MULTIPLE ELECTRICAL COMPONENTS

Filed Sept. 1, 1965

INVENTOR
SOLOMON SHATZ
BY
Paul M. Denk
ATTORNEY

United States Patent Office 3,401,309

Patented Sept. 10, 1968

3,401,309

ARRANGEMENT OF ELECTRICAL CIRCUITS AND MULTIPLE ELECTRICAL COMPONENTS

Solomon Shatz, 601B Kalen Drive, Overland, Mo. 63114

Filed Sept. 1, 1965, Ser. No. 484,359
7 Claims. (Cl. 317—101)

ABSTRACT OF THE DISCLOSURE

An arrangement of electrical components or electronic microcircuits that seat within a circuit board. Electrical connection is formed between the components and microcircuits by use of printed circuit or thin film deposits upon the upward and lower surfaces of the circuit board, and larger circuitry may be prepared by mounting one or more circuit boards within a master board or other circuit boards. The various components, microcircuits, and circuit boards securely mount within recesses provided within the master or circuit boards.

This invention relates in general to electrical apparatus, and more particularly, pertains to an arrangement of printed circuits and multiple electrical components.

It is an object of this invention to provide an arrangement of variously designed printed electric circuits which combine in their construction discrete electrical components such as resistors, transistors and micro-miniaturized circuits, and which are all disposed for combining and integrating a multitude of circuits into a desired total electric circuit pattern.

Present electrical circuits as manufactured in the electronics industry provide for the construction of total circuits from various electrical components, such as microcomponents and micro-circuitry which are interengaged by use of fragile and bulky wiring or electrically conductive tape. These electrical circuits as manufactured under existing methods are quite cumbersome in construction, having exposed their various components and wiring which normally are elevated and protrude above the surface when attached to a master board. As a result, such circuits are subject to deterioration and destruction through any shock, jarring, or vibration caused during accidental handling or even during normal usage. Also, circuits constructed under existing methods, because of their non-uniform and unstreamlined appearance, resulting from the attachment upon the surface of the master board of various sized electrical components, electrical circuits, and conductive wiring, cannot be readily combined with related master boards so as to be joined together for forming total and complete circuitry.

It is therefore another object of this invention to provide a novel and practical method for incorporating various sized printed circuit boards, containing discrete electrical elements and micro-miniaturized components or integrated circuits, with larger size printed circuit boards containing other components and circuits so that all the aforementioned may be joined together for forming a total circuit pattern.

It is a further object of this invention to provide for the fabrication into a total circuit pattern of various sized printed circuit boards and electrical components, such as, integrated circuits and electrical elements through an arrangement of the various associated parts in a smooth and continuous attachment allowing for the combining of a large number of said circuits and discrete electrical components into the desired pattern.

It is yet another object of this invention to provide for the construction of a total circuit pattern which is substantially free from any cumbersome electrical wiring or protruding electrical elements and integrated circuits, and that may be facilely and quickly manufactured and assembled on an inexpensive production basis.

It is still another object of this invention to provide an electrical apparatus which may have a plurality of connecting printed circuit boards and wherein the electrical components as integrated into said boards may be individually and readily removed and replaced upon their deterioration or failure in operation.

It is yet a further object of this invention to provide an electrical apparatus which includes integrating and imbedding in intimate contact a multitude of electrical components into a plurality of mounted circuits boards which thereby provide for an inherent conductor for rapidly absorbing and dissipating the created heat away from the operating components and circuits during usage.

Additional objects and details of this invention will become apparent from the following description when read in connection with the accompanying drawings (one sheet) wherein.

Figure 1:
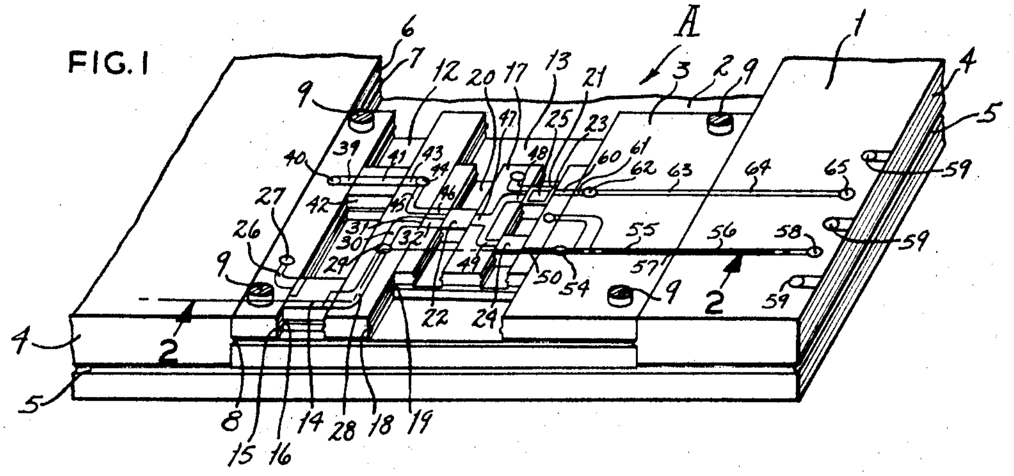
FIGURE 1 is a fragmentary isometric view of the electrical apparatus.

Referring now by reference characters to the drawings which illustrate one embodiment of the invention, A generally designates an electrical apparatus comprising a master board 1, which occasionally is referred to in the electronics field as a mother board. Master board 1 is provided with a recess 2 for accommodating a mounted circuit board 3. The master board 1, as well as mounted circuit board 3 and all other circuit boards in the electrical apparatus, are fabricated and constructed of a sturdy material such as insulated and non-conductive, heat dissipating plastic, glass, alumina, epoxy, diallyl phthalate, or other similar material, or when the electrical apparatus is of a miniature size, the master board and circuit boards may be constructed of a thin sheet-like material fabricated from a material which is normally used in the construction of such electronic mounting boards, such as phenolic resin, as is commonly used.

Figure 2:
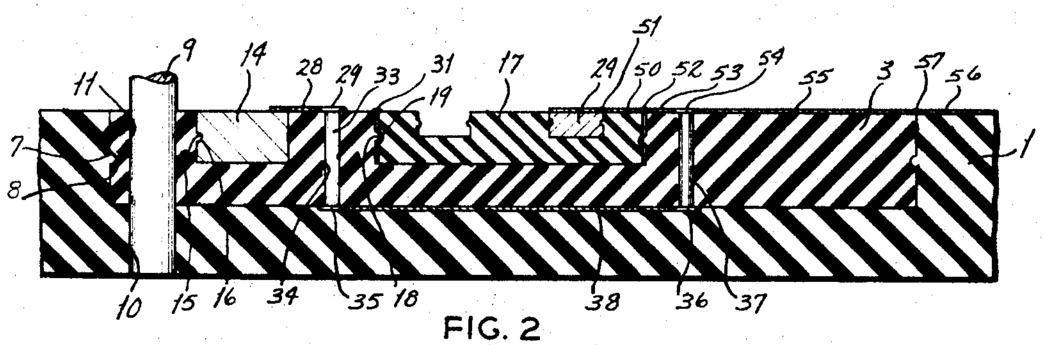
FIGURE 2 is a fragmentary sectional view of the electrical apparatus taken on line 2—2 of FIGURE 1.
Figure 3:
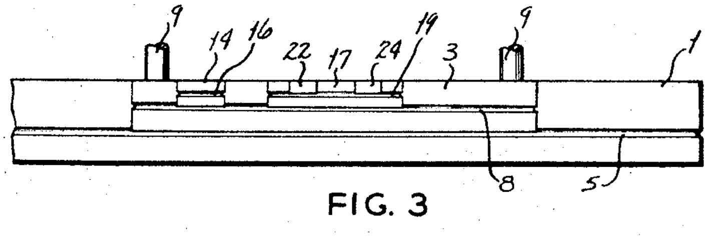
FIGURE 3 is a fragmentary frontal view of the electrical apparatus.

Master board 1 around its peripheral sides 4 contain indents 5 which provide for said board to be retained in the recess of a larger master board, if desired. Integral with the side walls 6 of the recess 2 in said master mounting board 1 are protrusions 7 that interlock with indents 8 provided in the sides of mounted circuit board 3. When it is desired to insert a circuit board into a master board, the former may be slidingly inserted into place by the engagement of the various protrusions within their complementary indents. Where the master board and the mounted circuit boards are constructed of a more resilient material, the circuit boards may be simply compressed downwardly into place within the recesses of the master board. It is also within the scope of this invention that the mounted circuit boards and master boards may not contain integral indents and protrusions respectively, but rather, the various boards may be simply interengaged by as close a tolerance fitting as is possible, and perhaps, a heat resistant adhesive to securely fix the parts into place. Such engagement is more practical and advantageous when the recesses are to be made in such small sizes as in thin mounted circuit boards where they are only for accommodating minute fragile electrical components such as micro-miniaturized integrated circuits. Extending upwardly from within the recess 2 of the master board are a plurality of pins 9 which may be loosely or rigidly affixed into said board, as at 10, and snugly fit through apertures 11 in the mounted circuit board. (See FIGURE 2.) When the master board and mounted circuit boards are constructed of an inflexible material, and have indents and protrusions that necessitate a sliding engagement of the two parts contiguously together, pins 9 may be disengaged from the master mounting board and removed to allow the mounted circuit board to be slidingly inserted into the board 1. After sliding of the board is completed, the pins may be replaced to secure the boards together into a locked position. When the master mounting board and mounted circuit board are fabricated from a more flexible material, the pins may be rigidly fixed into the board 1, and circuit board 3 need only be placed onto the pins 9 and lowered and pressed into place. Pins 9 may extend upwardly to any length desired so that other circuit boards may be inserted thereon and lowered into contact with additional mounted circuit boards where such is desired and found necessary to complete a circuit. Such a stacking of mounted circuit boards allows for a build up of various electrical components and circuits into a total circuit pattern.

Mounted circuit board 3, as revealed in FIGURE 1, has a series of recesses 12 and 13 provided therein where other electrical components such as other mounted circuit boards, electrical elements, or micro-integrated circuits may be inserted. The number, size, shape, width or depth of recesses that may be included and formed in a mounted circuit board will depend upon the type of circuitry desired and the size and shape of components to be inserted. For example, recess 12 is of such dimensions so as to accommodate an electrical component 14, such as a carbon resistor, capacitor, inductor, micro-miniature circuit, or other electrical element, or an integrated circuit. The electrical component 14 fits snugly within recess 12, and is retained therein by means of the complementary relationship between protrusions 15 and indents 16 located in the side walls of said recess and electrical component respectively. Component 14 may be inserted within recess 12 by either sliding the latter into engagement with the former, or by securing the component as by compressing from above, directly into place in a close tolerance fitting of one part into place within the other.

Within recess 13 there is located a mounted circuit board 17 which is secured in retention by means of protrusions 18 inserted within indents 19. Circuit board 17 may be constructed of a similar insulating material as that used in manufacturing the mounted circuit board 3 and master board 1, and also is provided with means for retaining other electrical components and micro-integrated circuits. Provided within mounted circuit board 17 are a plurality of recesses 20 and 21. Recess 20 has located therein an electrical component 22 which may be a discrete electrical element such as a resistor, capacitor, a complete circuit subassembly such as a monolithic or hybrid micro-miniaturized electronic circuit wafer, or may be in itself another mounted circuit board. Electrical component 22 may be retained within recess 20 by means of protrusions and indents, not shown, or may be held by a heat resistant and heat dissipating adhesive, or by a close tolerance fitting. Provided within recess 21 are a plurality of electrical components 23 and 24 which also may be separate electrical elements, mounted circuit boards, or miniature circuits. It is conceivable that the electrical components may also be constructed of a material similar to that which is utilized in manufacturing the mounted circuit boards, but that upon the upward surfaces of said components there may be deposited a thin-film capacitor, resitsor, transistor, or other semi-conductor wafer, as shown at 25. It should be noted that the various electrical components, i.e., electrical elements, micro circuits, and mounted circuit boards are retained in their various mountings at a depth which allows for their upward surfaces to be at a level flush with the surface of their respective mounting. Constructing the electrical apparatus in this manner makes it uniform in appearance and structure, and provides for other mounted circuit boards to be laid flush on the upper surface of previously inserted mounted circuit boards where such is required to build up a complete or total circuit pattern. But, certain electrical components as inserted within a mounted board recess may have upward surfaces that extend slightly above the upward surface of the associated mounted board so as to provide a slight exposed side edge that may enhance the securement between the board and component as when soldered.

Electrical connection is made between the various mounted circuit boards and electrical components by use of printed wiring. The printed wiring may be applied to the master board and the various mounted circuit boards by the usual method of evaporating a thin film of conductive metal to said boards and then acquire the desired circuit pattern by photographic masking, screen printing, etching, or other methods of printed wiring application that are commonly used in the electrical manufacturing trade. As revealed in FIGURE 1, printed wiring 26 joins land 27 with the input side of electrical component 14. Electrical connection between the printed wiring and the said electrical component may be made by electric weld, solder, or any other type of electrical conductive fastening means. It should be noted that the various printed wiring may be of varying dimensions depending upon the amount of current that is calculated to pass therethrough. Printed wiring 28 attaches to the opposite or output side of electrical component 14, and provides a conductive path to land 29. Land 29 by means of printed wiring path 30 joins, as at weld 31, to printed wiring 32 to provide for electrical conduction to component 22. Additionally, as disclosed in FIGURE 2, land 29 is integral with connection pin 33 and extends downward through the aperture 34 to the underside of mounted circuit board 3 and there attaches to land 35, which in turn, is secured with land 36 of connection pin 37 by printed wiring 38, and thus indicating how printed circuit connections for completing circuitry may be made on both the upward and underside surfaces of the various mounted circuit boards. Since printed wiring as used in the electronic field is of infinitesimal thickness, its use in providing conduction between the mounted boards and electrical components of this invention eliminates the bulkiness as presently exists in similar electronic items.

Printed wiring 39 joins to land 40, which may be attached to a connection pin and other printed wiring, not shown, on the undersurface of the mounted board 3. Printed wiring 39 at its other end joins integrally with printed wiring 41 which has been deposited upon a false component 42 which is provided within recess 12 simply for rendering support for said printed wiring 41. This printed wiring connects with similar printed wiring 43 which attaches to land 44. Printed wiring 45 joins to land 44, which may be attached to printed circuit on the undersurface of mounted board 3, not shown. Printed wiring 45 at its other end is connected to printed wiring 46 which also attaches to electrical component 22. Printed wiring 47 provides a conductive path away from the electrical component, and bifurcates into discrete lands 48 and 49 which are respectively joined to electrical components 23 and 24. Printed wiring 50 attaches at one end as by a weld or solder 51 to the output side of the electrical component 24, and joins at weld 52 to the printed wiring 53 which unites with land 54 of connection pin 37. Printed wiring 55 joins with land 54 at one end, and is secured to printed wiring 56 as at weld or solder 57. It should be noted that the printed wiring 55 constitutes a deposition of printed circuit upon mounted circuit board 3, whereas, printed wiring 56 is printed circuit upon master board 1, and thus is revealed a system for providing continuous circuitry between the various circuit boards. Printed wiring 56 attaches to terminal 58, which may be joined with one or more of the strip ends 59 depending upon the circuit desired, and thereby, providing the major output for the total circuit pattern.

In like manner printed wiring 60 joins with the output side of electrical component 23 and at the other end connects with printed wiring 61 which attaches to land 62. Land 62 attaches with printed wiring 63 which unites with printed wiring 64 to provide additional output for the circuitry through terminal 65. Terminal 65 may connect with one or more strip ends 59. When a total circuit pattern is prepared for use, for example, as in a computer, data processing, or other electrical machine, it may be inserted into place with the strip ends providing the electrical contact between the built up circuit and the machine utilizing the circuit pattern. It should be noted that other mounted circuit boards may be joined to master board 1, as disclosed in FIGURE 1, by stacking them in a laminable fashion contiguously with previously inserted mounted circuit boards, such as board 3, said mounted circuit boards being rigidly affixed into place by pins 9. Electrical connection may be made between the various stacked boards by arranging for the contact between the lands and printed wiring of the various boards. After the entire circuit pattern has been assembled and is ready for use, it may then be desirable to encapsulate the same with a coating of a common insulating material that is ordinarily used for preventing deterioration through usage or other forms of handling.

It is to be understood that this invention is not to be limited to the particular circuit pattern which is revealed in the drawing and described herein, but rather all arrangements of circuit patterns which are capable of being assembled by means of this invention are intended to be included within the scope of this invention. It is to be understood that the above-described arrangements are simply illustrative of the application of the principles of the invention. Numerous other arrangements may be readily devised by those skilled in the art which will embody the principles of the invention and fall within the spirit and scope thereof.

What is claimed:

1. An electrical apparatus comprising a first mounted circuit board having a recess therein, a second mounted circuit board, complementary protrusions and indents provided on said first and second mounted circuit boards maintaining said second mounted circuit board in sliding engagement with said first mounted circuit board, the upward surface of said second mounted circuit board being substantially level with the upward surface of said first mounted circuit board, and printed circuit providing electrical connection between said mounted circuit boards.

2. An electrical apparatus compristing a first mounted circuit board having a recess therein, a second mounted circuit board retained in said first mounted circuit board recess, the upward surface of said second mounted circuit board being substantially level with the upward surface of said first mounted circuit board, connection pins provided through said mounted circuit boards and extending from the upward surface to the underside of said mounted circuit board, and printed circuit providing electrical connection between said mounted circuit boards and connection pins.

3. An electrical apparatus comprising a master board, said master board having a recess provided therein and extending from side to side transversely across said master board, a circuit board disposed in said master board recess, the sides of said circuit board being contiguous with the sides of the master board recess, complementary protrusions and indents provided upon the contiguous sides of said master board and circuit board maintaining said circuit board mounted to said master board, the upward surface of said mounted circuit board being substantially level with the upward surface of said master board, and means providing electrical connection between said master board and mounted circuit board.

4. The invention of claim 3 wherein said master board and circuit board have aligned openings provided therethrough, and a pin disposed through said aligned openings securing said master board and circuit board together.

5. The invention of claim 3 and further characterized by a connection pin being provided through said circuit board extending from its upward surface to its underside, and means providing electrical connection between said master board and mounted circuit board through said connection pin.

6. An electrical apparatus comprising a mounted circuit board, said circuit board having a recess provided therein and extending transversely across said circuit board, an integrated circuit disposed in said mounted circuit board recess, the sides of said integrated circuit being contiguous with the sides of the circuit board recess, means retaining said integrated circuit in said circuit board recess, the upward surface of said integrated circuit being substantially level with the upward surface of said circuit board, and means providing electrical connection between said master board and integrated circuit.

7. The invention of claim 6 and further characterized by complementary protrusions and indents being provided upon the contiguous sides of said integrated circuit and circuit board maintaining said integrated circuit in sliding engagement with said circuit board.

References Cited

UNITED STATES PATENTS

| | | | |
|---|---|---|---|
| 3,061,816 | 10/1962 | Reynolds | 317—99 XR |
| 2,777,039 | 1/1957 | Thias. | |
| 2,945,163 | 7/1960 | Kilby et al. | |
| 3,027,627 | 4/1962 | Sturdy. | |
| 3,142,783 | 7/1964 | Warren. | |

OTHER REFERENCES

Keonjian: Microelectronics, McGraw-Hill, N.Y. 1963, p. 161.

DARRELL L. CLAY, *Primary Examiner.*

U.S. DEPARTMENT OF COMMERCE

PATENT OFFICE

Washington, D.C. 20231

UNITED STATES PATENT OFFICE

CERTIFICATE OF CORRECTION

Patent No. 3,401,309 September 10, 1968

Solomon Shatz

It is certified that error appears in the above identified patent and that said Letters Patent are hereby corrected as shown below:

Column 6, line 37, "master" should read -- circuit --.

Signed and sealed this 7th day of July 1970.

(SEAL)
Attest:

Edward M. Fletcher, Jr.
Attesting Officer

WILLIAM E. SCHUYLER, JR.
Commissioner of Patents

[redacted]